United States Patent
Zhang

(10) Patent No.: US 10,429,575 B2
(45) Date of Patent: Oct. 1, 2019

(54) BACKLIGHT MODULE AND LIQUID CRYSTAL DISPLAY DEVICE

(71) Applicant: WUHAN CHINA STAR OPTOELECTRONICS TECHNOLOGY CO., LTD., Wuhan, Hubei (CN)

(72) Inventor: Bingchuan Zhang, Hubei (CN)

(73) Assignee: WUHAN CHINA STAR OPTOELECTRONICS TECHNOLOGY CO., LTD., Wuhan, Hubei (CN)

( * ) Notice: Subject to any disclaimer, the term of this patent is extended or adjusted under 35 U.S.C. 154(b) by 0 days.

(21) Appl. No.: 15/575,181

(22) PCT Filed: Oct. 17, 2017

(86) PCT No.: PCT/CN2017/106492
§ 371 (c)(1),
(2) Date: Nov. 17, 2017

(87) PCT Pub. No.: WO2019/000711
PCT Pub. Date: Jan. 3, 2019

(65) Prior Publication Data
US 2019/0004241 A1    Jan. 3, 2019

(30) Foreign Application Priority Data
Jun. 28, 2017   (CN) .......................... 2017 1 0508318

(51) Int. Cl.
*G02F 1/13357*    (2006.01)
*F21V 8/00*    (2006.01)
*H05K 1/02*    (2006.01)
*H05K 1/18*    (2006.01)

(52) U.S. Cl.
CPC .......... *G02B 6/0085* (2013.01); *G02B 6/005* (2013.01); *G02B 6/009* (2013.01); *H05K 1/0204* (2013.01); *H05K 1/0209* (2013.01); *G02B 6/0055* (2013.01); *G02B 6/0083* (2013.01); *G02B 6/0088* (2013.01); *H05K 1/028* (2013.01); *H05K 1/0281* (2013.01); *H05K 1/189* (2013.01); *H05K 2201/0323* (2013.01); *H05K 2201/056* (2013.01); *H05K 2201/066* (2013.01);
(Continued)

(58) Field of Classification Search
CPC ........ G02F 2001/133314; G02F 2001/133317; G02B 6/0085; G02B 6/005; G02B 6/009; H05K 1/0209; H05K 1/0323
USPC .......................................... 349/65
See application file for complete search history.

(56) References Cited

U.S. PATENT DOCUMENTS

| 8,497,951 B2* | 7/2013 | Kobayashi ........ G02F 1/133308 345/102 |
| 2016/0187567 A1* | 6/2016 | Zhou ...................... G02B 6/005 349/65 |

(Continued)

*Primary Examiner* — Karabi Guharay
(74) *Attorney, Agent, or Firm* — Ladas & Parry LLP

(57) ABSTRACT

A backlight module and a liquid crystal display device are provided. An outer wall located on the light incident side of the plastic frame is arc-shaped, so a graphite sheet attached to a flexible printed circuit board can be attached to a backside of a reflector plate along the arc-shaped outer wall, thereby increasing the size of the graphite and enhancing heat dissipation efficiency of the backlight module.

15 Claims, 2 Drawing Sheets

(52) U.S. Cl.
CPC ............. *H05K 2201/10106* (2013.01); *H05K 2201/10136* (2013.01)

(56) References Cited

U.S. PATENT DOCUMENTS

2016/0377908 A1* 12/2016 Shin ................. G02F 1/133308
    349/58
2017/0052311 A1* 2/2017 Lautenschlager .... G02B 6/0065

* cited by examiner

BACKLIGHT MODULE AND LIQUID CRYSTAL DISPLAY DEVICE

FIELD OF THE DISCLOSURE

The present disclosure relates to the field of optical displays, and more particularly to a backlight module and a liquid crystal display device.

BACKGROUND

With development of display technology, people have higher requirements for terminal display panels, and resolution of the terminal display panels is also increasing. As the resolution of the terminal display panel increases, this lowers a light penetration rate. Thus, backlight brightness of a backlight module must be improved to ensure normal use of a terminal.

Recently, a method of increasing the backlight brightness of the backlight module increases number of light emitting diodes (LEDs), or increases drive current for the light emitting diodes. In either case, temperature of the LEDs will be greatly increased. Hence, a reasonable cooling design is required.

Existing backlight modules mostly use graphite for heat exchange. That is, the graphite is adhered on the flexible printed circuit board for heat exchange. However, since the graphite is unfolded, size of adhering portion is relatively small and heat dissipation efficiency is poor.

SUMMARY OF THE DISCLOSURE

The present disclosure provides a backlight module and a liquid crystal display device, by which problem resulting from poor heat dissipation of backlight module can be solved, thereby improving heat dissipation efficiency of the backlight module.

One embodiment of the present disclosure provides a backlight module, including:

a light guide plate, a reflector plate, a plastic frame, a flexible printed circuit board, a light source, a graphite sheet, a frame shaped adhesive, and a film, where the light guide plate includes a light incident side, a light reflection side, and a light output side, and the light incident side is perpendicular to the light output side;

the reflector plate is disposed on the light reflection side of the light guide plate, and the reflector plate includes a reflecting surface and a backside;

the light source is disposed on the light incident side of the light guide plate;

the flexible printed circuit board is disposed over the light output side of the light guide plate, and the light source is connected to the flexible printed circuit board;

the plastic frame is disposed on the light incident side of the light guide plate, an outer wall located on the light incident side of the plastic frame is arc-shaped;

the graphite sheet is adhered on a side opposite to the light source of the flexible printed circuit board, and the graphite sheet is bent and adheres on the plastic frame along the arc-shaped outer wall of the plastic frame, and the graphite sheet further extends and adheres on the backside of the reflector plate;

the frame shaped adhesive is disposed on the graphite sheet, and the frame shaped adhesive is provided with an exhaust hole; and the film is disposed on the light output side of the light guide plate for converging an emitted light from the light guide plate.

In some embodiments, the light reflection side of the light guide plate is connected with the reflecting surface of the reflector plate.

In some embodiments, the light source is a light emitting diode.

In some embodiments, a side of the plastic frame facing the light incident side protrudes and engages between the reflector plate and the flexible printed circuit board for fixing the backlight module.

In some embodiments, the backlight module also includes a panel, where the panel is disposed over the light output side of the light guide plate.

One embodiment of the present disclosure also provides a backlight module, including:

a light guide plate, a reflector plate, a plastic frame, a flexible printed circuit board, a light source, and a graphite sheet, where the light guide plate includes a light incident side, a light reflection side, and a light output side, and the light incident side is perpendicular to the light output side;

the reflector plate is disposed on the light reflection side of the light guide plate, and the reflector plate includes a reflecting surface and a backside;

the light source is disposed on the light incident side of the light guide plate;

the flexible printed circuit board is disposed over the light output side of the light guide plate, and the light source is connected to the flexible printed circuit board;

the plastic frame is disposed on the light incident side of the light guide plate, an outer wall located on the light incident side of the plastic frame is arc-shaped;

the graphite sheet is adhered on a side opposite to the light source of the flexible printed circuit board, and the graphite sheet is bent and adheres on the plastic frame along the arc-shaped outer wall of the plastic frame, and the graphite sheet further extends and adheres on the backside of the reflector plate.

In some embodiments, the backlight module also includes a frame shaped adhesive, where the frame shaped adhesive is disposed on the graphite sheet.

In some embodiments, the frame shaped adhesive is provided with an exhaust hole.

In some embodiments, the backlight module also includes a film, where the film is disposed on the light output side of the light guide plate for converging an emitted light from the light guide plate.

In some embodiments, the light reflection side of the light guide plate is connected with the reflecting surface of the reflector plate.

In some embodiments, the light source is a light emitting diode.

In some embodiments, a side of the plastic frame facing the light incident side protrudes and engages between the reflector plate and the flexible printed circuit board for fixing the backlight module.

In some embodiments, the backlight module also includes a panel, where the panel is disposed over the light output side of the light guide plate.

In some embodiments, a thickness of the light guide plate is between 0.03 to 0.06 centimeters.

One embodiment of the present disclosure also provides a liquid crystal display device, which includes the backlight module as described above.

The present disclosure provides a backlight module and a liquid crystal display device, where an outer wall located on the light incident side of the plastic frame is arc-shaped, such that a graphite sheet attached to a flexible printed circuit board can be attached to a backside of a reflector plate along the arc-shaped outer wall, thereby increasing the size of the graphite and enhancing a heat dissipation efficiency of the backlight module.

DETAILED DESCRIPTION

Figure 1:
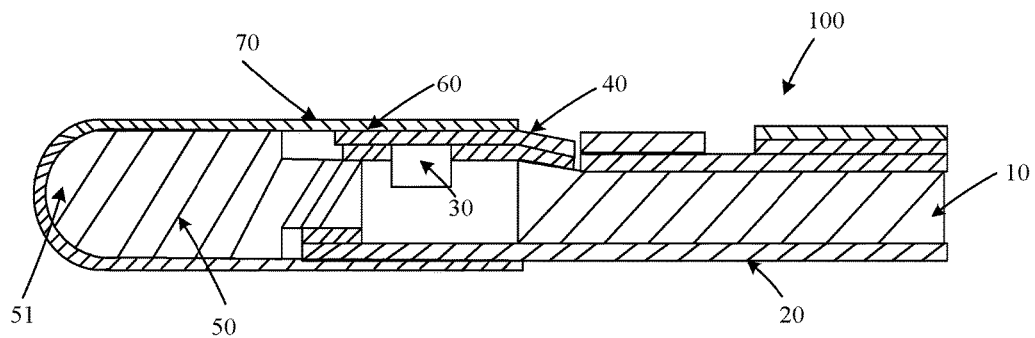
FIG. 1 is a structural diagram of a backlight module according to an embodiment of the present disclosure.

Referring to drawings, a same component symbol represents a same component, and a principle of the present disclosure is implemented in a suitable computing environment for illustrative purposes. The following description is based on exemplary embodiments of the present disclosure, which should not be construed as limiting the present invention, unless otherwise specified The term "embodiment" used in this specification means serving as an example, implementation, or illustration. Furthermore, the articles "a" and "an" used in the specification and the appended claims may generally be construed to mean "one or more" unless specified otherwise or clear from the context to be directed to a singular form.

In the description of the present disclosure, it should be understood that the orientation or positional relationship indicated by the terms "center", "longitudinal", "transverse", "length", "width", "thickness", "upper", "lower", "front", "rear", "left", "right", "vertical", "horizontal", "top", "bottom", "internal", "external", "clockwise", "anti-clockwise", and the like means the orientation or positional relationship illustrated based on the drawings, and is only used for the convenience of describing the present disclosure and simplifying the description, rather than teaching or suggesting that the indicated device or element has to take the special orientation, or be designed and operated in the special orientation, and hence cannot be understood as a limitation to the present disclosure.

It should be noted that, in the description of the present disclosure, unless explicitly regulated and restricted otherwise, the terms "install", "connect", and "couple" should be understood in a broad sense, for example, may be a permanent connection, may also be a detachable connection, or an integral connection; may be a mechanical connection, may also be electrically connected or can communicate with each other; may be coupled directly, may also be indirectly coupled through intermediate parts, or may be the internal communication or interactions between two elements. A skilled person in this art can appreciate the specific meaning in the present disclosure of the above terms according to specific circumstances.

Furthermore, unless specified or limited otherwise, a structure in which a first feature is "on" or "below" a second feature may include an embodiment in which the first feature is in direct contact with the second feature, and may also include an embodiment in which the first feature and the second feature are not in direct contact with each other, but are contacted via an additional feature formed therebetween. Moreover, a first feature "on", "above", or "on top of" a second feature may include an embodiment in which the first feature is right or obliquely "on", "above", or "on top of" the second feature, or it could mean that the first feature is at a height higher than that of the second feature; while a first feature "below", "under", or "on bottom of" a second feature may include an embodiment in which the first feature is right or obliquely "below", "under", or "on bottom of" the second feature, or it could mean that the first feature is at a height lower than that of the second feature.

Various embodiments and examples are provided in the following description to implement different structures of the present disclosure. In order to simplify the present disclosure, certain elements and settings will be described. However, these elements and settings are only by way of example and are not intended to limit the present disclosure. In addition, reference numerals may be repeated in different examples in the present disclosure. This repeating is for the purpose of simplification and clarity and does not refer to relations between different embodiments and/or settings. Furthermore, examples of different processes and materials are provided in the present disclosure. However, it would be appreciated by those skilled in the art that other processes and/or materials may also be applied.

Referring to FIG. 1, which is a structural diagram of a backlight module according to an embodiment of the present disclosure. The backlight module 100 includes a light guide plate 10, a reflector plate 20, a light source 30, a flexible printed circuit board 40, a plastic frame 50, a graphite sheet 60, and a frame shaped adhesive 70.

The light guide plate 10 includes a light incident side, a light reflection side, and a light output side. The light incident side is perpendicular to the light output side, and the light incident side is perpendicular to the light reflection side. The light incident side is opposite to the light reflection side. The light guide plate 10 can effectively distribute the light source into a backlight window area light source. In one embodiment, a thickness of the light guide plate 10 is between 0.03 to 0.06 mm. In one embodiment, the light guide plate 10 can be laser engraved to form a one-piece structure.

The reflector plate 20 is disposed on the light reflection side of the light guide plate 20, and the reflector plate 20 includes a reflecting surface and a backside. The reflecting surface of the reflector plate 20 is connected with the light reflection side of the light guide plate 10 for reflecting and reusing the light emitted from the light reflection side of the light guide plate 10. The backside of the reflector plate 20 is made of an opaque material to prevent light emitted from the light reflection side of the light guide plate 10 from passing through the reflector plate, causing interference to the backlight module 100. The light source 30 is disposed on the light incident side of the light guide plate 10 for providing light to the light guide plate 10. In one embodiment, the light source 30 may be a light emitting diode.

The flexible printed circuit board 40 is disposed over the light output side of the light guide plate 10, and the light source 30 is connected to the flexible printed circuit board 40 via a wire. The flexible printed circuit board can control the current to turn on or off the light source 30.

The plastic frame 50 is disposed on the light incident side of the light guide plate 50. The plastic frame is convex toward the light incident side and is embedded between the reflector plate 20 and the flexible printed circuit board 40 for supporting the backlight module 100. The plastic frame 50 enables components of the backlight module 100 to be firmly bonded together, closing an internal space of the backlight module 100 to prevent external dust from entering. An outer wall 51 located on the light incident side of the plastic frame 50 is arc-shaped.

The graphite sheet 60 is adhered on a side opposite to the light source 30 of the flexible printed circuit board 40, and the graphite sheet 60 is bent and adheres on the plastic frame 50 along the arc-shaped outer wall 51 of the plastic frame 50, and the graphite sheet 60 further extends and adheres on the backside of the reflector plate 20. Due to the non-folding properties of graphite, the adhesive size of the graphite sheet 60 is greatly improved, and heat dissipation efficiency of the backlight module 100 is increased.

The frame shaped adhesive 70 is disposed on the graphite sheet 60 for fastening the graphite sheet 60 to the backlight module 100.

Figure 2:
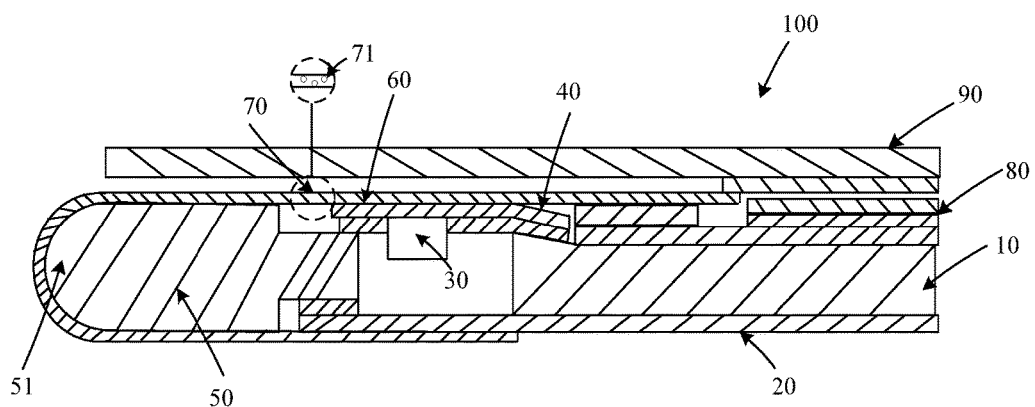
FIG. 2 is another structural diagram of a backlight module according to an embodiment of the present disclosure.
Figure 3:
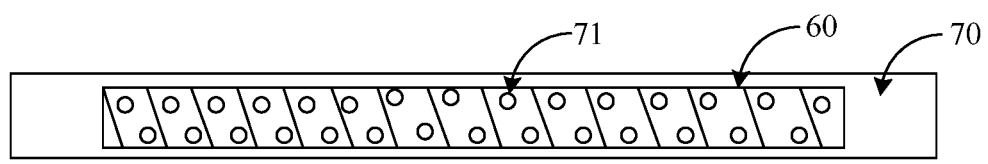
FIG. 3 is a structural diagram of a heat dissipation assembly according to an embodiment of the present disclosure.

Refer to FIG. 2 and FIG. 3. FIG. 2 is another structural diagram of a backlight module according to an embodiment of the present disclosure, and FIG. 3 is a structural diagram of a heat dissipation assembly according to an embodiment of the present disclosure. The backlight module 100 also includes a film 80 and a panel 90. The heat dissipation assembly includes a graphite sheet 60 and a frame shaped adhesive 70.

The film 80 is disposed on the light output side of the light guide plate 10 for converging an emitted light from the light guide plate 10, thereby increasing brightness of backlight module 100. In one embodiment, the film 80 may be a brightness enhancement film.

The panel 90 is disposed over the light output side of the film 80 for displaying corresponding information according to the received light.

The graphite sheet 60 is adhered on a side opposite to the light source 30 of the flexible printed circuit board 40, such that the graphite sheet 60 absorbs the heat generated through operation of the light source 30. The graphite sheet 60 is bent and adheres on the plastic frame 50 along the arc-shaped outer wall 51 of the plastic frame 50, and the graphite sheet 60 further extends and adheres on the backside of the reflector plate 20. Due to the non-folding properties of graphite, the adhesive size of the graphite sheet 60 is greatly improved, and heat dissipation efficiency of the graphite sheet 60 is increased.

The frame shaped adhesive 70 is covered on the graphite sheet 60 and is longer in length than the length of the graphite sheet 60 to fix the graphite sheet 60. The frame shaped adhesive 70 is also provided with a plurality of exhaust holes 71 on the area where the graphite sheet 60 is adhered, for removing the heat absorbed by the graphite sheet 60 from the flexible printed circuit board 40 from the exhaust hole 71, thereby ensuring a stability of heat dissipation of the backlight module 100.

In conclusion, the present disclosure provides a backlight module and a liquid crystal display device, where an outer wall located on the light incident side of the plastic frame is arc-shaped, such that a graphite sheet attached to a flexible printed circuit board can be attached to a backside of a reflector plate along the arc-shaped outer wall, thereby increasing the size of the graphite and enhancing a heat dissipation efficiency of the backlight module.

Although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. With particular regard to the various functions performed by the above described components, the terms used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the disclosure. In addition, while a particular feature of the disclosure may have been disclosed with respect to only one of several implementations, such a feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising".

In summary, although the preferable embodiments of the present disclosure have been disclosed above, the embodiments are not intended to limit the present disclosure. A person of ordinary skill in the art, without departing from the spirit and scope of the present disclosure, can make various modifications and variations. Therefore, the scope of the disclosure is defined in the claims.

What is claimed is:

1. A backlight module, comprising: a light guide plate, a reflector plate, a plastic frame, a flexible printed circuit board, a light source, a graphite sheet, a frame shaped adhesive, and a film, wherein the light guide plate comprises a light incident side, a light reflection side, and a light output side, and the light incident side is perpendicular to the light output side;

the reflector plate is disposed on the light reflection side of the light guide plate, and the reflector plate comprises a reflecting surface and a backside;

the light source is disposed on the light incident side of the light guide plate;

the flexible printed circuit board is disposed over the light output side of the light guide plate, and the light source is connected to the flexible printed circuit board;

the plastic frame is disposed on the light incident side of the light guide plate, an outer wall located on the light incident side of the plastic frame is arc-shaped;

the graphite sheet is adhered on a side opposite to the light source of the flexible printed circuit board, and the graphite sheet is bent and adheres on the plastic frame along the arc-shaped outer wall of the plastic frame, and the graphite sheet further extends and adheres on the backside of the reflector plate;

the frame shaped adhesive is disposed on the graphite sheet, and the frame shaped adhesive is provided with an exhaust hole; and the film is disposed on the light output side of the light guide plate for converging emitted light from the light guide plate.

2. The backlight module as claimed in claim 1, wherein the light reflection side of the light guide plate is connected with the reflecting surface of the reflector plate.

3. The backlight module as claimed in claim 1, wherein the light source is a light emitting diode.

4. The backlight module as claimed in claim 3, wherein a side of the plastic frame facing the light incident side protrudes and engages between the reflector plate and the flexible printed circuit board for fixing the backlight module.

5. The backlight module as claimed in claim 1, further comprising a panel, wherein the panel is disposed over the light output side of the light guide plate.

6. A backlight module, comprising: a light guide plate, a reflector plate, a plastic frame, a flexible printed circuit board, a light source, a frame shaped adhesive, and a graphite sheet,
- wherein the light guide plate comprises a light incident side, a light reflection side, and a light output side, and the light incident side is perpendicular to the light output side;
- the reflector plate is disposed on the light reflection side of the light guide plate, and the reflector plate comprises a reflecting surface and a backside;
- the light source is disposed on the light incident side of the light guide plate;
- the flexible printed circuit board is disposed over the light output side of the light guide plate, and the light source is connected to the flexible printed circuit board;
- the plastic frame is disposed on the light incident side of the light guide plate, an outer wall located on the light incident side of the plastic frame is arc-shaped;
- the graphite sheet is adhered on a side opposite to the light source of the flexible printed circuit board, and the graphite sheet is bent and adheres on the plastic frame along the arc-shaped outer wall of the plastic frame, and the graphite sheet further extends and adheres on the backside of the reflector plate; and
- the frame shaped adhesive is disposed on the graphite sheet, and the frame shaped adhesive is provided with an exhaust hole.

7. The backlight module as claimed in claim 6, further comprising a film, wherein the film is disposed on the light output side of the light guide plate for converging emitted light from the light guide plate, and wherein a side of the plastic frame facing the light incident side protrudes and engages between the reflector plate and the flexible printed circuit board for fixing the backlight module.

8. The backlight module as claimed in claim 6, wherein the light reflection side of the light guide plate is connected with the reflecting surface of the reflector plate.

9. The backlight module as claimed in claim 8, wherein a side of the plastic frame facing the light incident side protrudes and engages between the reflector plate and the flexible printed circuit board for fixing the backlight module.

10. The backlight module as claimed in claim 6, wherein the light source is a light emitting diode.

11. The backlight module as claimed in claim 10, wherein a side of the plastic frame facing the light incident side protrudes and engages between the reflector plate and the flexible printed circuit board for fixing the backlight module.

12. The backlight module as claimed in claim 6, wherein a side of the plastic frame facing the light incident side protrudes and engages between the reflector plate and the flexible printed circuit board for fixing the backlight module.

13. The backlight module as claimed in claim 6, further comprising a panel, wherein the panel is disposed over the light output side of the light guide plate.

14. The backlight module as claimed in claim 13, wherein a thickness of the light guide plate is between 0.03 to 0.06 centimeters.

15. A liquid crystal display device, comprising the backlight module as claimed in claim 6.

* * * * *